United States Patent
Ouyang et al.

(10) Patent No.: US 7,825,990 B2
(45) Date of Patent: Nov. 2, 2010

(54) METHOD AND APPARATUS FOR ANALOG GRAPHICS SAMPLE CLOCK FREQUENCY OFFSET DETECTION AND VERIFICATION

(75) Inventors: Bing Ouyang, Plano, TX (US); John Michael Hayden, Allen, TX (US); Troy Lane Ethridge, Bedford, TX (US); Anuradha Sundararajan, Plano, TX (US); Larry D. Dickinson, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1266 days.

(21) Appl. No.: 11/355,815

(22) Filed: Feb. 16, 2006

(65) Prior Publication Data

US 2006/0274194 A1    Dec. 7, 2006

Related U.S. Application Data

(60) Provisional application No. 60/687,291, filed on Jun. 3, 2005.

(51) Int. Cl.
*H03M 1/12* (2006.01)
(52) U.S. Cl. ............... 348/572; 348/537; 348/536; 348/739
(58) Field of Classification Search ........... 348/537, 348/572, 573, 536, 539, 524, 543, 544, 739; 375/355, 362, 373–376; 345/520, 204, 213; 341/155
See application file for complete search history.

(56) References Cited

U.S. PATENT DOCUMENTS

| | | | |
|---|---|---|---|
| 5,767,916 A | 6/1998 | West | |
| 5,805,233 A | 9/1998 | West | |
| 5,847,701 A | 12/1998 | Eglit | |
| 5,990,968 A * | 11/1999 | Naka et al. | 348/537 |
| 6,097,444 A | 8/2000 | Nakano | |
| 6,700,570 B2 * | 3/2004 | Tachibana et al. | 345/213 |
| 7,486,336 B2 * | 2/2009 | Huang et al. | 348/572 |
| 7,502,076 B2 * | 3/2009 | Xiu et al. | 348/572 |

* cited by examiner

*Primary Examiner*—David L Ometz
*Assistant Examiner*—Jean W Désir
(74) *Attorney, Agent, or Firm*—Charles A. Brill; Wade James Brady, III; Frederick J. Telecky, Jr.

(57) ABSTRACT

A method and apparatus for an analog-to-digital video signal converter. The converter is controlled by a clock with controllable frequency and phase for sampling an analog signal. A circuit corrects the clock frequency using a period of a columnar frame differences as a function of columnar location. The sampling clock frequency is changed by an amount dependent on the period of the columnar differences. A second measure of the difference between successive frames is computed for a sequence of clock phases. The frequency of the clock is verified using a characteristic of the second measure. The characteristic can be the ratio of the maximum to the minimum of the second measure over selected clock phases. Other characteristics can be used such as a difference of a maximum and a minimum measure.

21 Claims, 6 Drawing Sheets

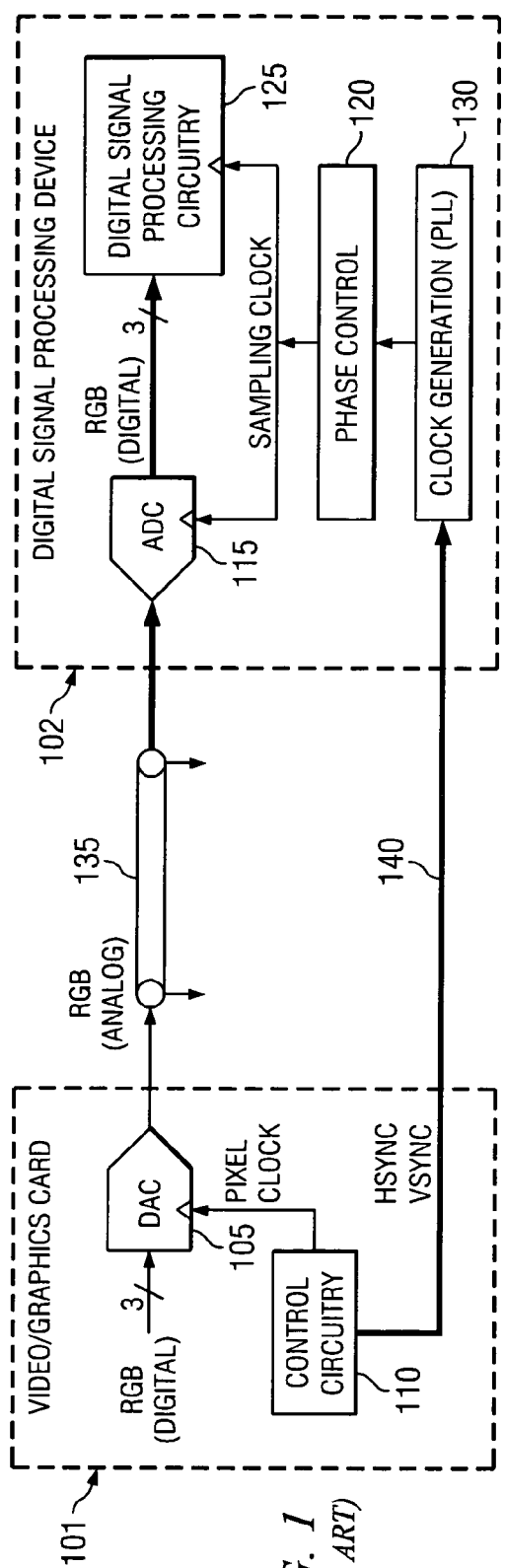
FIG. 1 (PRIOR ART)
FIG. 2 (PRIOR ART)
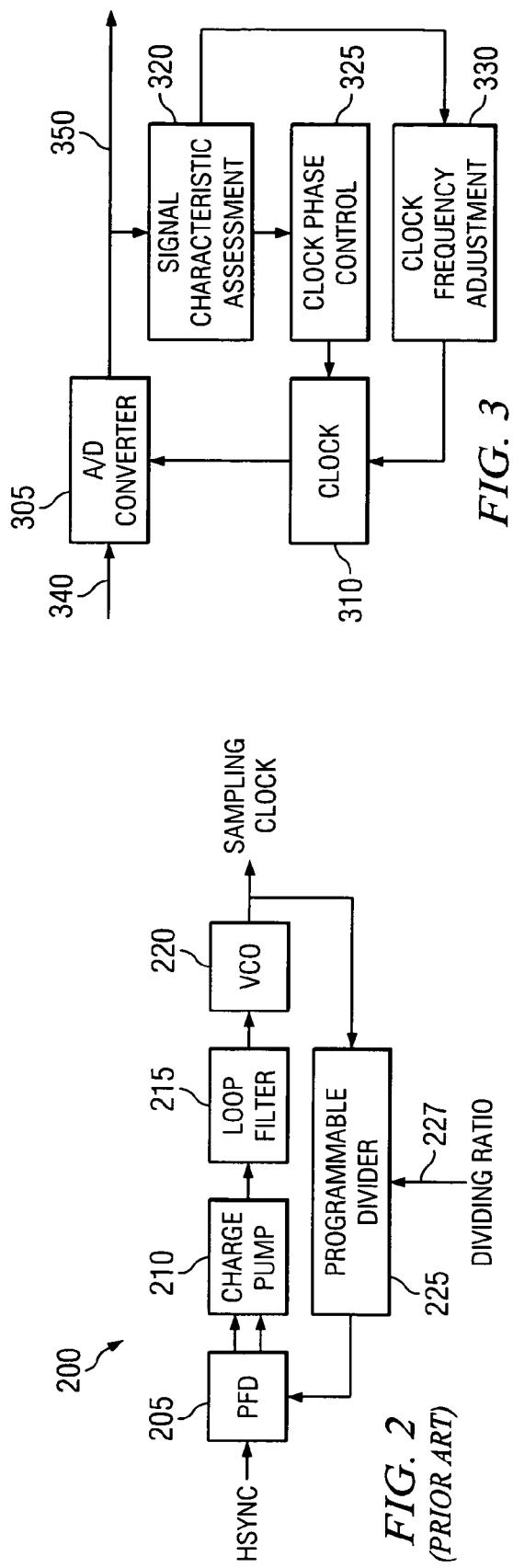
FIG. 3

METHOD AND APPARATUS FOR ANALOG GRAPHICS SAMPLE CLOCK FREQUENCY OFFSET DETECTION AND VERIFICATION

This application claims priority to provisional patent application Ser. No. 60/687,291, filed Jun. 3, 2005, entitled "System and Method for Autolock", which application is hereby incorporated herein by reference.

CROSS-REFERENCE TO RELATED APPLICATIONS

This application also relates to co-pending and commonly assigned patent application Ser. No. 11/355,789, filed concurrently herewith, entitled "Method and Apparatus for Analog Graphics Sample Clock Frequency Verification."

TECHNICAL FIELD

This invention relates generally to analog-to-digital conversion for digital video devices, and in particular, to a method and implementation for automatically selecting the sampling frequency for an analog video signal prior to conversion to a digital format.

BACKGROUND

When analog video signals such as R'G'B'(red-green-blue) or $Y'P_bP_r$ (luma-chroma) video signals of a video graphics source are processed in a digital video processing circuit, such as employed in a digital television receiver, graphics digitizers that perform analog-to-digital conversion are utilized to convert the analog signals to a digital format. The conversion of a signal including color content from an analog to a digital format generally utilizes three analog-to-digital converters (ADCs), which convert, for example, red, green, and blue analog signals to digital signals simultaneously. In analog-to-digital conversion, identifying the correct sampling frequency for the ADCs is essential since even a small error in sampling frequency can impair the resulting displayed images. The phase of the sampling clock for analog-to-digital conversion is also critical since improper selection of phase can also create undesirable visible effects. The sampling phase is the point in time within a sampling clock's cycle for triggering the ADC. Thus, when a pixelated display device is driven with analog signals, particularly analog signals that originate from a digital source such as a PC (personal computer), a processing arrangement or circuit is required to automatically search for the correct sampling frequency to produce a high quality image. This is necessary because analog signals are generally produced from signals derived from a clock with frequency that is generally not perfectly synchronized with the frequency of a local clock controlling the analog-to-digital converters. In addition, a circuit or process may also be required to automatically search for the appropriate sampling phase, as described in co-pending application Ser. No. 11/187,313, filed Jul. 21, 2005, attorney docket number TI-39898, which is hereby incorporated herein by reference.

Examples of graphics display devices developed for personal computers and television receivers that can utilize a digital video signal are liquid crystal displays (LCDs) and DLP® image projection systems. LCDs offer space savings, lower radiation, and lower power consumption compared to cathode-ray tube (CRT) monitors which can directly use analog video inputs. DLP® image projection arrangements enable implementation of systems displaying a large, high-definition image at reasonable cost. Since an analog display interface is still a widely used interface between an image source and a display device, particularly in the personal-computer industry, the use of graphics digitizers to convert analog signals to digital signals has become a vital process for interfacing image sources to digital display devices such as LCDs. Commercial devices formed as integrated circuits are available to provide analog-to-digital video conversion. Such devices generally contain three ADCs that simultaneously convert red, green, and blue analog video signals to corresponding video signals in a digital format.

FIG. 1 illustrates an exemplary block diagram showing interconnection of signals in a pixelated video system, for example, a "digital display system." Pixelated video systems are distinguishable from analog display systems such as CRTs by displaying images with fixed pixel locations that are formed in a manufacturing process. CRTs display an image over a continuous surface such as the surface of a CRT, and accordingly can be driven directly with analog signals.

In the block diagram illustrated in FIG. 1, video or graphics images are generated by a video/graphics card 101 such as a video/graphics card in a personal computer. Digital images are converted in this card to analog waveforms by digital-to-analog converters (DACs) such as DAC 105. Digital signals such as RGB signals in a digital format are supplied to the DAC from an external source (not shown). The analog waveforms produced by the digital-to-analog conversion are coupled over line 135 to digital signal processing device 102 and converted to a digital format by ADC 115. Control circuitry 110 controls the DAC and produces horizontal and vertical synchronization signals HSYNC and VSYNC that are coupled to the display device over line 140. In the display device, a clock generation circuit 130, usually implemented with a phase-locked loop (PLL), generates a sampling clock signal though a phase control circuit 120 to control the sampling instant of the ADC and display circuitry 125. In such display applications, a key issue for high quality image recovery is accurate determination of both the sampling frequency and the sampling phase for the ADCs. These two factors have a dominant impact on the quality of displayed images.

A phase-locked loop 200 such as illustrated in FIG. 2 is commonly used to generate the sampling frequency for the ADCs. When a PLL is locked onto the horizontal synchronization signal (HSYNC), its output can be used as the sampling clock for the ADCs. The dividing ratio of the programmable frequency divider 225 is typically controlled by an input signal, 227, related to the "number of total pixels per video line" for a given video/graphics mode. Thus, the resulting frequency of the sampling clock is the HSYNC frequency multiplied by the "number of total pixels per video line." Ideally, by this mechanism, the sampling clock will have the same frequency as that of the pixel clock in the video card. However, this does not occur in practice because the low frequency HSYNC signal is usually noisy and has significant timing jitter. Furthermore, its frequency may not be accurate. In addition, the pixel clock frequency of the image source such as a video/graphics card might not be equal to a specified frequency. As a result, the original image that is encoded in the analog signals may not be accurately recovered. Thus, a process to accurately determine the sampling frequency is essential in practical applications to display the high quality images demanded by PC and digital television applications.

In the exemplary block diagram illustrated in FIG. 2, PFD 205 is a frequency and phase detector that converts the frequency or phase difference of its two inputs to voltage signals. The voltage-controlled oscillator (VCO) 220 is an oscillator with frequency dependent on an input control voltage. The programmable frequency divider 225 in the feedback loop divides the VCO frequency to a proportionately lower value dependant on the dividing ratio signal 227. The charge pump 210 and the loop filter 215 convert and filter the PFD output to a signal level with noise sufficiently attenuated that it can be utilized as input by the VCO. The output of the VCO (which is the sampling clock of the ADC) is locked to the HSYNC signal through the programmable frequency divider. The dividing ratio of the programmable frequency divider determines the VCO frequency. Ideally, this ratio should be the number of pixels per video line. However, the number represented by the "number of pixels per video line" is not always consistently used by video sources such as video card vendors, and the resulting frequency will not be correct in those cases, again demonstrating that an improved frequency detection process is required to find the correct dividing ratio so that a high quality image can be displayed.

Eglit, in U.S. Pat. No. 5,847,701 entitled "Method and Apparatus Implemented in a Computer System for Determining the Frequency Used by a Graphics Source for Generating an Analog Display Signal," dated December, 1998, describes searching sampling frequencies using predetermined test patterns. Sequences of test patterns are encoded in an analog video source and transmitted to a digital display device where the analog signal is converted to sequences of sampled values. The digital display device determines whether the sampled values equal one of the sequences of the test patterns based on a predetermined convention. The digital display device changes the sampling frequency until the sampled values equal one of the test pattern sequences, and the corresponding frequency is used as the ADC sampling frequency when a match is found. Thus, Eglit in U.S. Pat. No. 5,847,701 requires predetermined test patterns encoded in an analog video source, which in turn requires additional hardware and software. Unfortunately, display device designers usually do not have control over how the video source is configured and how it is designed. Moreover, the operation uses a feedback system which does not specify how the next sampling frequency should be determined. The scheme just varies the sampling frequency, which poses a convergence timing problem. Thus, using the method described by Eglit, a mechanism is still required to efficiently determine the next sampling frequency and impractical constraints placed thereby on the display device designer are not resolved.

Nakano, in U.S. Pat. No. 6,097,444 entitled "Automatic Image Quality Adjustment Device Adjusting Phase of Sampling Clock for Analog Video Signal to Digital Video Signal Conversion," dated August, 2000, describes choosing the sampling frequency by detecting the HSYNC and VSYNC frequencies and comparing them to the commonly used industry standard video timing data. The standard video timing mode whose timing data most closely resembles the detected HSYNC and VSYNC frequencies is the desired mode. The corresponding pixel frequency is used as the sampling frequency. However, a problem with this scheme is that the pixel frequency specified in industry standards is often used just as a guideline. In real applications, significant frequency deviations occur and a degree of frequency error in the pixel clock is unavoidable, the latter of which adversely affects image quality.

West, in U.S. Pat. Nos. 5,805,233 and 5,767,916, both entitled "Method and Apparatus for Automatic Pixel Clock Phase and Frequency Correction in Analog to Digital Video Signal Conversion," presents a method of determining a pixel clock sampling frequency using the actual width of a video image, measured by the number of pixel clock cycles, and compares it to an expected image width to adjust the pixel clock sampling frequency. However, the methods described by West depend on the absence of blanked regions in the video image to produce an accurate pixel clock sampling frequency.

Other approaches to selecting the correct sampling clock frequency use a static lookup table which involves building a large table that contains all potential clock candidates as well as all the information that is used in the search and identification of the optimum clock candidate. The data in this table would generally include a variety of statistics about the analog video source such as horizontal and vertical synchronization rates, blanking time, active data area, image refresh frequency, etc.

Table approaches to selecting sampling clock frequency can be a burden to a digital system in several ways. One is cost, because an entire table of video image characteristics must be stored within the digital system. A second is the time required to search the table to identify an optimal clock candidate. A third is the need for continuing product support for table updates to accommodate new analog graphics sources that may be developed after product development.

Further approaches utilize the image aspect ratio to compute the sampling clock frequency. Some digital systems calculate the sampling clock frequency by scaling the horizontal pixel resolution by a ratio of the total horizontal system clock time per video line to the active horizontal system clock time per video line. This approach works well when the analog video signal has detectable data across the active portion of the horizontal line and the image is of a known aspect ratio, such as an aspect ratio of 4:3. But in recent years, various "wide-mode" analog graphics sources have appeared. These sources can have various image aspect ratios such as 16:9, 16:10, etc., and sometimes the image aspect ratios are unpredictable. Since there is no way to determine beforehand the image aspect ratio reliably, this method cannot handle the present and expected range of wide-mode analog graphics signals.

In order to correctly adjust the sample clock frequency using the timing ratio described above, useful image data must be present across the active video region. When there is no data at the left or right borders of the image, for example, when the image contains "black borders," such as the black borders 404 and 405 as shown in FIG. 4, the actual system clock measurement will be incorrect, and the sampling clock frequency will not be calculated correctly. In FIG. 4, a video image 400 is illustrated with an active region including black borders 404 and 405 on the left and right sides, respectively, of a detected active region 406.

The main limitations of the prior art circuits are thus imprecise, unreliable, or impractical determination of the sampling frequency for reconstruction of an image for a digital display device. Prior art approaches use processes that employ test patterns or image data tables, rely on imprecise clocks for digital to-analog conversion, compute with noisy data, rely on the absence of blanked areas on the sides of the image, and depend on signals with substantial overshoot and undershoot. A need thus exists for an apparatus and method to accurately determine the sampling frequency and to select a reliable sampling phase so that a digital image can be displayed that is not degraded by these limitations.

SUMMARY OF THE INVENTION

Embodiments of the present invention achieve technical advantages as a video signal conversion device that receives an analog signal representing an image formed of pixels in video lines and produces a digital signal representative of the video image. Video lines include an active video region, and may include pixels representing blanked regions on the sides of the image. An analog-to-digital converter, coupled to a clock with controllable frequency, receives the analog signal and converts it into the digital signal. The clock controls the sampling points of the analog signal for the analog-to-digital converter.

In a preferred embodiment, a circuit corrects the clock frequency using a period of a measure of the difference between successive frames taken in a columnar region of the video image. The measure is a function that is dependent on the location of the columnar region.

In a preferred embodiment, the measure of the difference between successive frames is a count, taken over pixels in a columnar region at least one column wide of the video image, of the magnitude of the difference between a digitized pixel value in one frame and the corresponding digitized pixel value in a following frame. The count is taken for the magnitude of the difference exceeding a threshold value. In a further preferred embodiment, the measure of the difference is taken for columnar regions comprising a plurality of columns.

In a preferred embodiment, the clock frequency is corrected by increasing or decreasing the clock frequency by an amount dependent on the period of the measure as a function of columnar location.

In a further preferred embodiment, the clock has selectable phase, and the video signal conversion device further comprises a circuit to compute, for each phase in a sequence of selected phases for the clock, a second measure as the difference between successive frames of the video image, using the digital signal. The frequency of the clock is verified using a characteristic of the second measure of the difference between successive frames.

In a preferred embodiment, the characteristic is the ratio of the maximum of the second measure to the minimum of the second measure over the sequence of selected phases. In a preferred embodiment, the second measure of the difference between successive frames is a count, taken over pixels, of the magnitude of the difference between a digitized pixel value in one frame and the corresponding digitized pixel value in a following frame. In a preferred embodiment, the count is taken of the number of times the magnitude exceeds a threshold value. In a preferred embodiment, the circuit for verifying the frequency of the clock compares the characteristic to a threshold value. In a preferred embodiment, the sequence of selected phases for the clock is a sequence of regularly spaced phases.

Another embodiment of the present invention is a method of constructing a video signal conversion device to receive an analog signal of a video image formed as a sequence of frames of video lines of pixels, and to produce a digital signal representative of the video image. In a preferred embodiment, video lines include an active video region, which may include pixels representing blanked regions on the sides of the image. The method includes coupling an analog-to-digital converter for receiving the analog signal to a clock with controllable frequency, sampling the analog signal at sampling points controlled by the clock for conversion into the digital signal, computing a measure for the digital signal of the difference between successive frames of the video image in a columnar region at least one column wide, observing a period of the measure as a function of columnar region location, and correcting the clock frequency using the period of the measure as a function of columnar location.

In a preferred embodiment, the method includes computing the measure for the digital signal of the difference between successive frames of the video image in columnar regions at least one column wide.

In a preferred embodiment, the method includes computing a count, taken over pixels in a columnar region, of the magnitude of the difference between a digitized pixel value in one frame and the corresponding digitized pixel value in a following frame, for the magnitude exceeding a threshold value. In a further preferred embodiment, the method includes taking the count for columnar regions comprising a plurality of columns.

In a preferred embodiment, correcting the clock frequency comprises increasing or decreasing the clock frequency by an amount dependent on the period of the measure as a function of columnar location.

In a further preferred embodiment, the method includes using a clock with a selectable phase. The method further includes computing, for each phase in a sequence of selected phases for the clock, a second measure as the difference between successive frames of the video image, using the digital signal; and verifying the frequency of the clock using a characteristic of the second measure of the difference between successive frames.

In a preferred embodiment, the method includes using the ratio of the maximum of the second measure to the minimum of the second measure over the sequence of selected phases for the characteristic.

In a preferred embodiment, the method includes, for computing the second measure of the difference between successive frames, using a count, taken over pixels, of the magnitude of the difference between a digitized pixel value in one frame and the corresponding digitized pixel value in a following frame. In a preferred embodiment, the count is taken of the number of times the magnitude exceeds a threshold value.

In a preferred embodiment, the method includes verifying the frequency of the clock by comparing the characteristic to a threshold value.

In a preferred embodiment, the method includes using a sequence of regularly spaced phases for the sequence of selected phases Embodiments of the invention solve the problem of accurately converting an analog signal representing a video image formed as a sequence of frames of video lines of pixels into a digital signal representative of the video image. The required sampling frequency for the analog-to-digital converter is corrected and verified by using a characteristic of a measure of the difference between successive frames.

Embodiments of the present invention advantageously provide a video signal conversion device and method that can convert from analog signals into a digital format with high quality, and without the need to accurately predefine the properties of the video signal, or to exclude images with a blanked area on an image side.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 illustrates an exemplary block diagram of the prior art showing the interconnection of signals in a pixelated display system;

FIG. 2 illustrates a phase-locked loop of the prior art;

FIG. 3 illustrates an analog-to-digital converter controlled by a process of an embodiment of the present invention;

DETAILED DESCRIPTION OF ILLUSTRATIVE EMBODIMENTS

Figure 4:
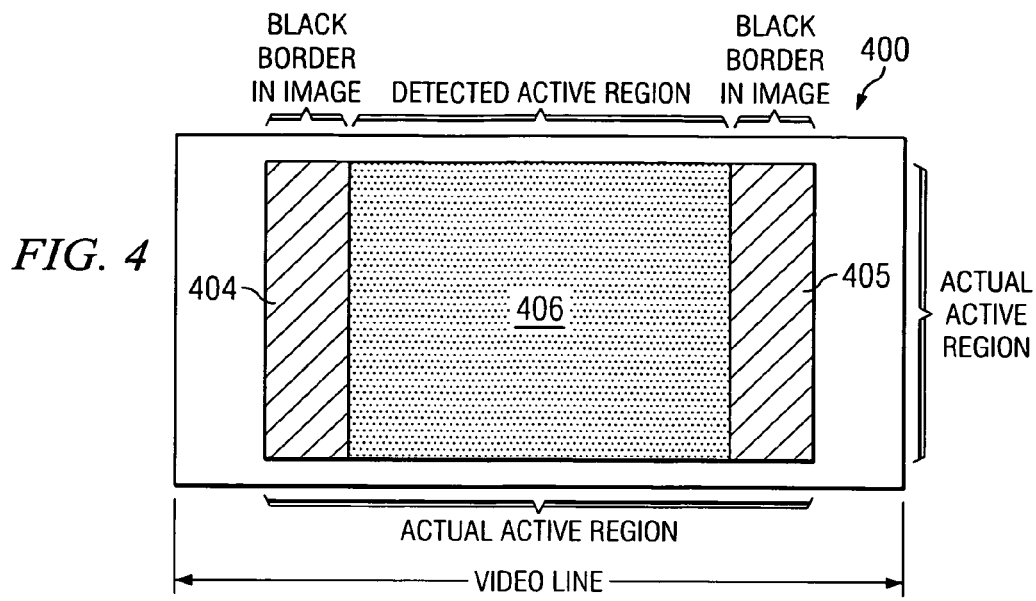
FIG. 4 illustrates an video image containing an active video region with black borders.

The making and using of presently preferred embodiments are discussed in detail below. It should be appreciated, however, that the invention provides many applicable inventive concepts that can be embodied in a wide variety of specific contexts. The specific embodiments discussed are merely illustrative of specific ways to make and use the invention, and do not limit the scope of the invention.

Embodiments of the invention will be described with respect to preferred embodiments in a specific context, namely an apparatus and method for selecting the sampling frequency for an analog video signal for conversion to a digital format. For the digital video source to be a true representation of the analog video source, the analog-to-digital converter must use the correct sampling clock frequency and an appropriately selected phase of the sampling clock. To insure the correct sampling clock frequency for an analog video source, embodiments comprise a process that computes for selected sampling clock phases a frame difference count of the magnitude of pixel-by-pixel differences exceeding a threshold, representing a measure of a difference between successive frames. Embodiments further comprise a process to select a sampling clock frequency for the analog-to-digital converter by selecting a frequency that produces a characteristic behavior of frame difference, as sampling clock phase is varied, of the count of the magnitude of pixel-by-pixel differences between successive frames exceeding a threshold, representing a frame difference between the successive frames. Other measures for frame-to-frame difference may also be used as described hereinbelow. Further embodiments comprise a process to determine the sampling frequency for an analog-to-digital converter by controlling the dividing ratio of a programmable frequency divider controlling a sampling clock frequency so that a count of the magnitude of pixel-by-pixel differences between successive frames exceeding a threshold, representing a frame difference between successive frames, illustrates a characteristic appearance as sampling phase is varied. Of course, other measures of frame-to-frame difference may also be used to control the dividing ratio of a programmable frequency divider.

FIG. 3 illustrates an analog-to-digital converter 305 controlled by a process or method of the present invention. Input signal 340 represents an analog video input signal generated by a digital system such as a PC or a digital television receiver. The analog-to-digital converter 305 produces a sampled digital output signal 350 representing the video image. The analog-to-digital converter 305 samples the input signal 340 at sampling times controlled by the sampling clock 310. The sampling times for the analog-to-digital converter are typically controlled by low-to-high transitions of the clock waveform in a practical circuit. The signal characteristic assessment block 320 computes a characteristic of the digital signal 350 such as by assessing a count of the magnitude of pixel differences between successive video frames exceeding a threshold. The block 320 selectively controls a sequence of phases of clock 310 to make the signal characteristic assessment. The result of the assessment may be an adjustment to or change in the clock frequency performed in the block 330. Particular elements of the process illustrated in FIG. 3 will be described in further detail in explanatory material following hereinbelow.

Figure 5:
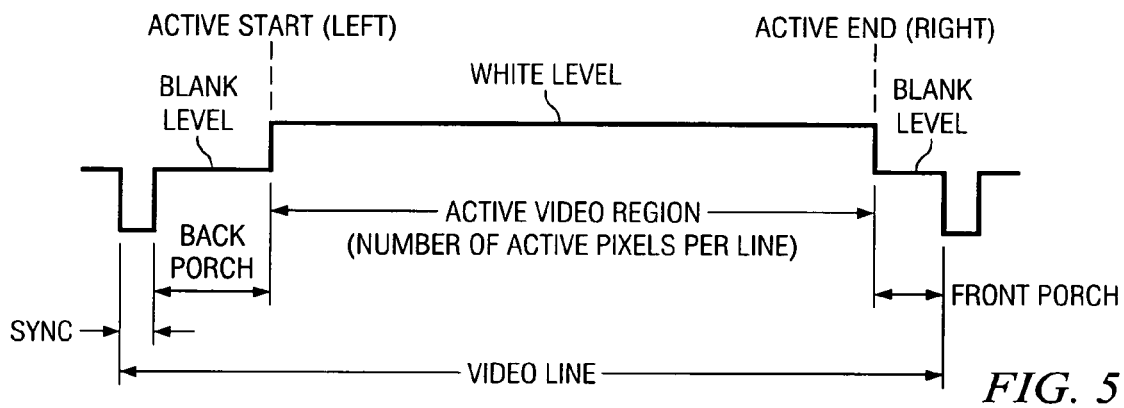
FIG. 5 illustrates a nominal waveform of a video signal.

FIG. 5 illustrates a typical waveform of a video signal. Pixels in the active video region depict information that can be seen by viewers. Thus, any error in the number of active pixels per video line will be apparent to a viewer. This number is determined by the definition of the given image format, including the image refresh rate. The correct sampling clock frequency in the display device produces the correct number of active pixels per video line in the active video region. The correct sampling clock frequency ideally should precisely equal the pixel clock frequency of a video source such as a video/graphics card.

The video image signal illustrated in FIG. 5 can represent various image aspect ratios such as 4:3, 16:9, or 16:10. The number of active video pixels in the active video region depends on the aspect ratio. Thus, the particular number of active pixels per line, which affects the pixel clock frequency, can generally not be assumed to be known beforehand. For example, a video image with one image aspect ratio could be formed with 1280 pixels, while another could be formed with be 1024 pixels, or 1366, etc. The XGA video standard may require a 65 MHz pixel clock, whereas the wide XGA video standard (WXGA) may require a higher pixel clock frequency such as a 75 MHz clock. A candidate clock frequency can be tested using the method of the invention, which allows different possible pixel clock frequencies to be used and synchronized.

The pixel clock frequency is generally not transmitted from a video source to a video signal processing device as illustrated in FIG. 1. For example, for an 800×600 display format, i.e., for a video image containing 600 horizontal lines and 800 pixels in each horizontal line, precisely 800 pixels should be correctly displayed in a horizontal line. A signal containing a synchronization waveform component may be superimposed onto the analog signal waveform representing the image as illustrated in FIG. 5.

Figure 6:
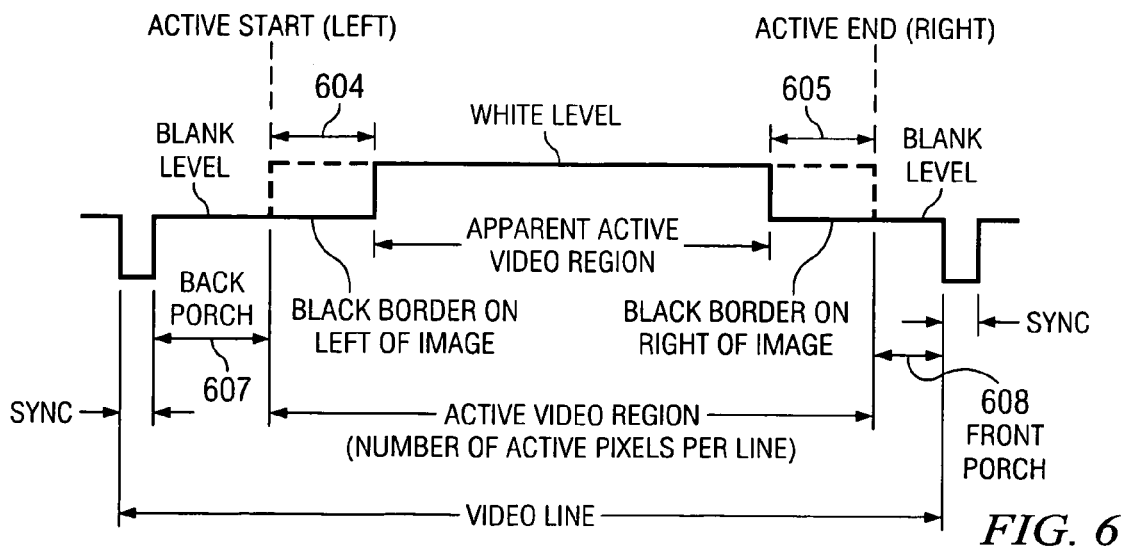
FIG. 6 illustrates a nominal waveform of a video signal containing black borders on the left and right sides of the image.

FIG. 6 illustrates a typical waveform of a video signal including black borders on the left and right edges of the image. Black borders are generally at the same signal level as the blanking level. Consequently, as illustrated in the figure, the apparent active video region is narrower than the true active video region, which would produce an inaccurate pixel count for a system attempting to measure the active video region. As an example, for Windows™-based PC applications, users may use some kind of screen background with substantial regions on the left and right sides of the image with black backgrounds. Examples such as these can produce an inaccurate pixel count, particularly when applications are run on a background with substantial black areas on the side of an image.

Figure 7:
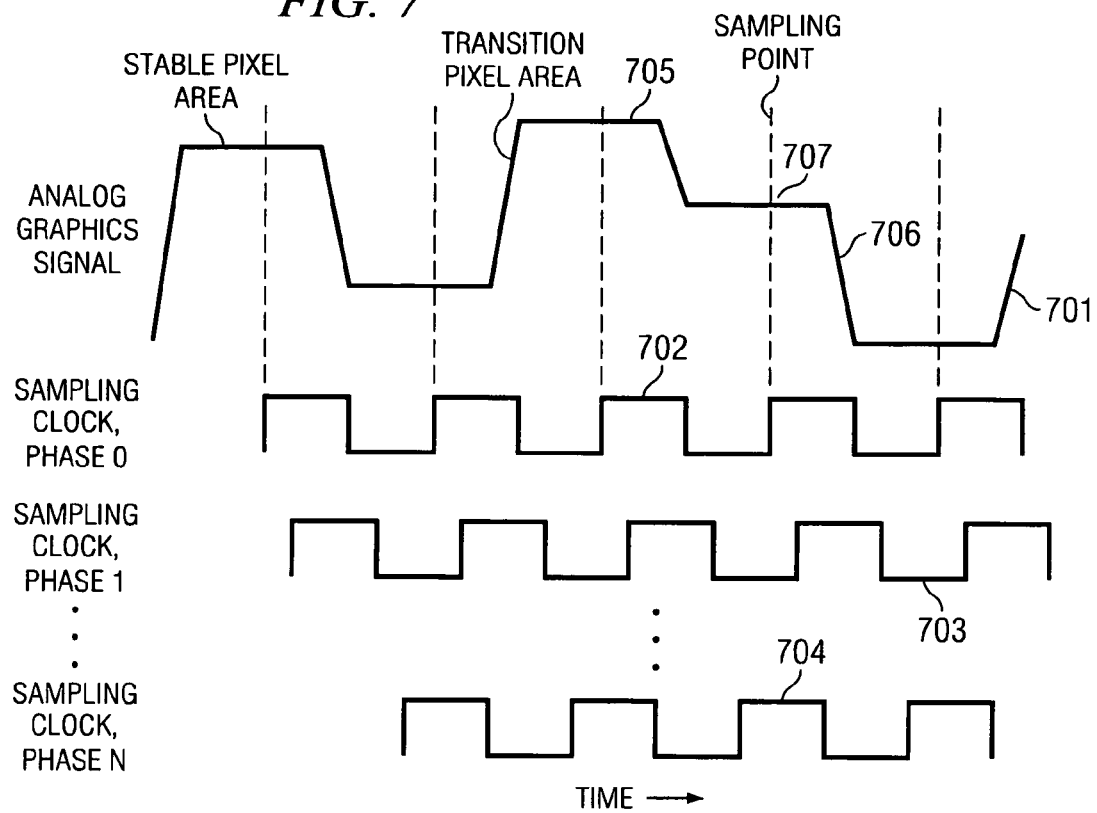
FIG. 7 illustrates an analog graphics signal derived from a digital source and a series of sampling clock waveforms, each sampling clock synchronized with the pixel frequency, with a sequence of sampling clock phases.

FIG. 7 illustrates a portion of an active video analog graphics signal 701 originating from a digital video source. As represented by FIG. 7, the RGB values of pixels in the active video region would typically be significantly different from those in the front and back porch regions where the RGB values are at the blank (or black) level. The signal includes stable pixel areas, such as pixel area 705, and transition pixel areas, such as transition pixel area 706 that lie between pixels in the original image. Ideally, the analog graphics signal would be sampled near the middle of the stable pixel areas, such as at sampling point 707. A sequence of sampling clock waveforms, 702, 703, and 704, representing clock phases 0, 1, and N are illustrated. In a video system, the number of phases N is frequently 32. In a typical system the sampling time for the analog graphics signal occurs at the rising edge of the sampling clock waveform. For the sampling clock waveform 702 illustrated in the figure, this waveform has the correct sampling frequency and a proper sampling phase for the analog graphics signal 701. A sampling clock waveform (not shown) with phase lying roughly midway between phase 0 and phase N, which would sample the analog graphics signal 701 near the transition pixel areas, which are regions of the waveform with substantial amplitude uncertainty, will generally produce a sampled signal with inaccurate signal amplitudes because the sampled points will not align with pixels in the original image.

In general, the best sampling points produce an image that best resembles the original image. Good sampling points are at intervals of time where the waveforms are flat and the signals "settle down." Overshoot and undershoot areas occur where the video signal is still in transition, and sampling should be avoided.

Figure 8:
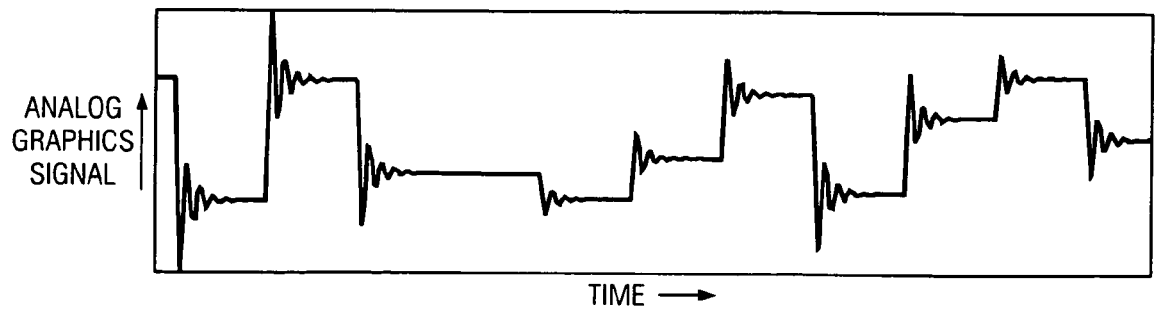
FIG. 8 illustrates a typical analog graphics signal, showing ringing, overshoot, and undershoot.

In reality the "flat" areas of the analog video waveform are not as well developed as those shown in FIG. 7, and generally exhibit some overshoot, undershoot, and ringing such as illustrated in FIG. 8. The slope of the transitions between the pixel areas depends on the bandwidth of components in the signal processing chain. The relatively vertical transition areas in this figure indicate a wide bandwidth system.

Figure 9:
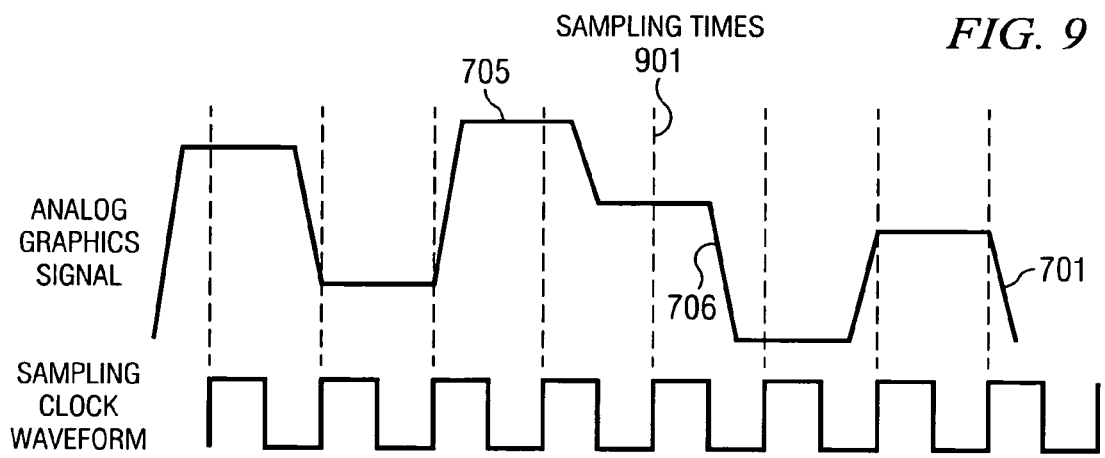
FIG. 9 illustrates an analog graphics signal derived from a digital source and a sampling clock waveform with sampling clock frequency unsynchronized to the pixel frequency.

FIG. 9 again illustrates the analog graphics signal 701. The stable and transitional pixel areas, 705 and 706, are as previously described with reference to FIG. 7, and sampling time or (times) 901 is an exemplary sampling time aligned with a rising edge of the sampling clock waveform. The frequency of the sampling clock waveforms illustrated in FIG. 9 is now not synchronized with the frequency of the pixels in the waveform 701. When the sampling clock frequency is not synchronized with the pixel frequency, no sampling clock phase can be selected to accurately reproduce the amplitude of all the pixels in the waveform 701 as illustrated in the figure.

The method and apparatus of the invention employ a signal processing technique called frame differencing to overcome limitations of determining sampling clock frequency described previously above with reference to the prior art. Frame differencing employs a measure of the difference between successive video frames to assess the accuracy of the sampling clock frequency.

In a frame differencing operation of the invention, two successive frames of a video image are stored. Preferably, the successive frames are immediately adjacent in time without an intervening frame. The absolute value of the pixel intensity difference at the same frame location (pixel location) is computed between the two frame with. A count of frame pixel differences, (or "accumulated error"), frame_difference_count, for these two frames is calculated by taking the absolute value of the difference of signal values for pixel locations, preferably for active pixel locations, and comparing the absolute value to a pixel-difference threshold. In the exemplary embodiment, if the absolute value of the difference exceeds the pixel-difference threshold, the frame_difference_count is incremented until the end of the frame is reached (or until selected pixels have been summed):

```
frame_difference_count = 0
For every active row
    For every active column
        If (( | Frame₁_Pixel(column,row) − Frame₂_Pixel(column,row) | ) >
            pixel_difference_threshold )
            Then increment the frame_difference_count (preferably by one)
    End column
End row
```

An active row is a row containing pixels with signal amplitude different from the black (blanking) level. This calculation computes the count of frame differences for one phase setting of the current pixel clock frequency in the video analog-to-digital converter. Most current video analog-to-digital converters, as indicated above, allow 32 phase selections of the clock frequency. Each phase selection is 1/32 of a 360° rotation of the clock sampling period. A count of the absolute value of the pixel intensity difference for any pixel intensity difference above a certain threshold for the whole frame is thus accumulated. Exemplary values for the pixel_difference_threshold are 4-8, but a value of 0 could also be used. The calculation is repeated for other phases of the sampling clock. The calculation need not be performed for every pixel in a frame as described further later below.

Figure 10:
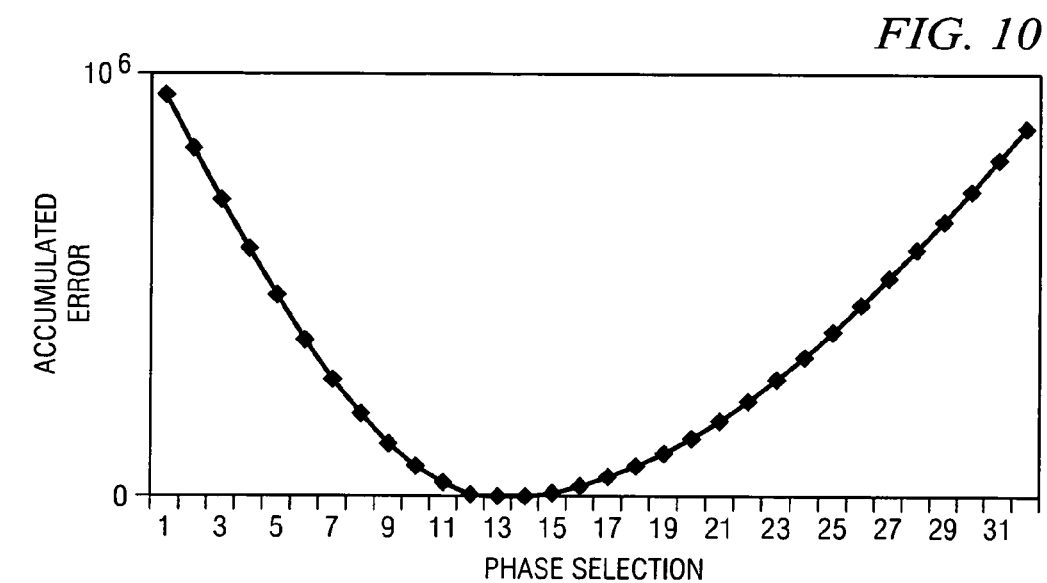
FIG. 10 illustrates a summed inter-frame pixel error plot vs. sampling clock phase with synchronized sampling clock frequency, of an embodiment of the present invention.
Figure 11:
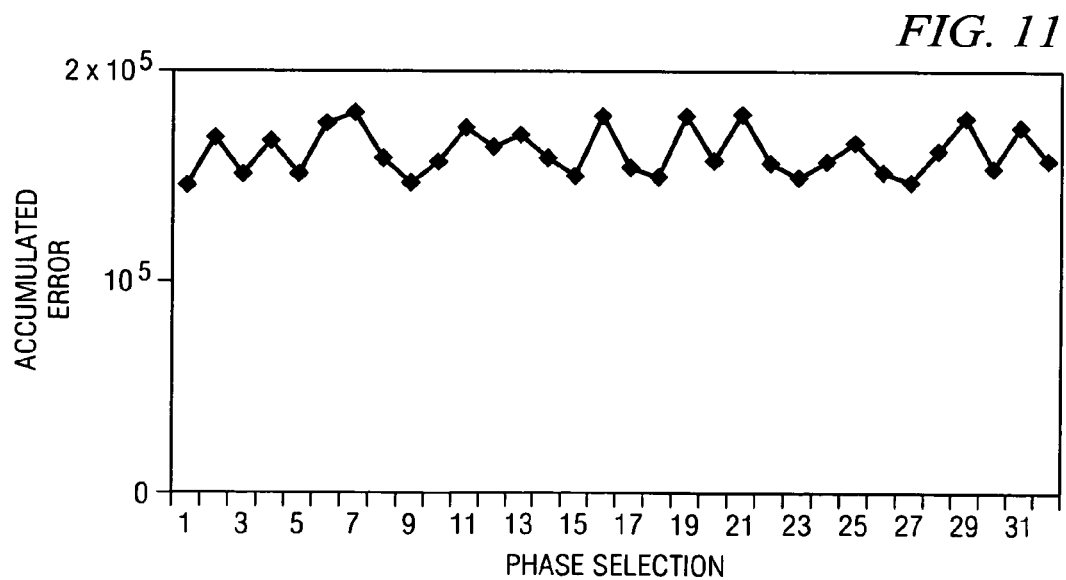
FIG. 11 illustrates a summed inter-frame pixel error plot vs. sampling clock phase with unsynchronized sampling clock frequency, of an embodiment of the present invention.

Several characteristics of a frame difference function are used to facilitate sampling clock verification and adjustment. One characteristic is a plot of frame_difference_count vs. sampling clock phase, which shows a markedly different appearance for correct and incorrect sampling clock frequencies. At the correct sampling clock frequency, a plot of frame_difference_count ("accumulated error") vs. phase produces a "bowl" shape distribution as illustrated in FIG. 10. At incorrect sampling clock frequencies, the plot is "substantially flat" as illustrated in FIG. 11. This characteristic of frame_difference_count vs. phase can be used as a tool for clock frequency verification.

Figure 12A:
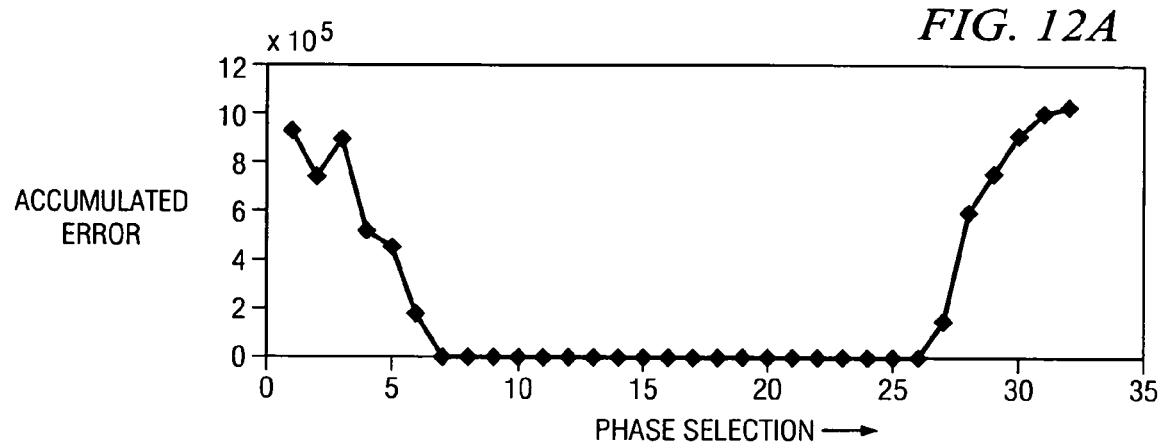
FIGS. 12A and 12B illustrates further examples of plots of summed pixel error vs. sampling clock phase for synchronized and unsynchronized sampling clock frequency, of an embodiment of the present invention.
Figure 12B:
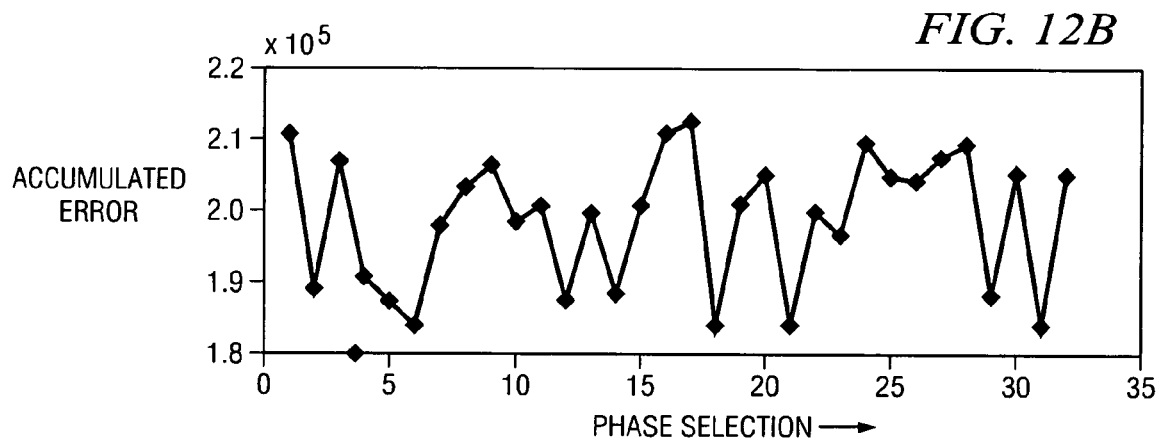

FIGS. 12A and 12B illustrate further examples of characteristic graphs of frame_difference_count plotted against sampling clock phase. The plot in FIG. 12A illustrates correct sampling clock frequency. The plot in FIG. 12B illustrates incorrect sampling clock frequency. These plots were produced using a higher threshold value for the pixel_difference_threshold (using a threshold value of 8), and throwing away the three least significant bits of 10-bit pixels representing one color of a 1024-by-768 pixel image.

In general, for plots such as those illustrated in FIGS. 10, 11, 12A, and 12B, the scale on the vertical axis depends on the number of pixels in the image, the particular measure used to assess frame-to-frame differences, the number of bits in a pixel element, and the relative rate of change in the sequence of video images. The scales used in these figures are intended to represent one exemplary embodiment of the method.

Clock frequency verification can be achieved in a simplified embodiment of the invention by analyzing only a subset of sampling clock phases, preferably equally spaced phases, which can substantially reduce the time required to verify the sampling clock frequency over sampling with every phase. This simplification can allow a wide range of clock frequencies to be tested quickly.

The simplification of using only a subset of equally spaced clock sampling phases forms the basis of clock frequency verification called Coarse Phase Analysis (CPA). A preferred implementation of CPA can be described functionally as follows:

Select the number of phases (num_phase) to be used in the CPA, (e.g., 4-32 phases)
Select a verification threshold (v_th), (e.g., 5-10) and
Loop num_phase times:
   adjust the ADC phase, preferably by equal increments
   run the frame pixel difference comparison computation to collect an error count
End loop.

Determine the ratio of the maximum frame_difference_count to the minimum frame_difference_count for the selected sampling clock phases:

$$\text{CPA\_ratio} = \frac{\text{Max(frame\_difference\_count)}}{\text{Min(frame\_difference\_count)}} \quad (1)$$

If CPA_ratio>v_th
Then: current sampling clock frequency is correct;
Else: current sampling clock frequency is incorrect.

Although equation (1) indicates computing a characteristic which is a ratio of a maximum frame_difference_count to a minimum frame_difference_count, alternative characteristic functions can be used within the broad scope of the invention, such as, without limitation, a difference between a maximum frame_difference_count and a minimum frame_difference_count, and the inverse of the ratio indicated by equation 1.

Figure 13:
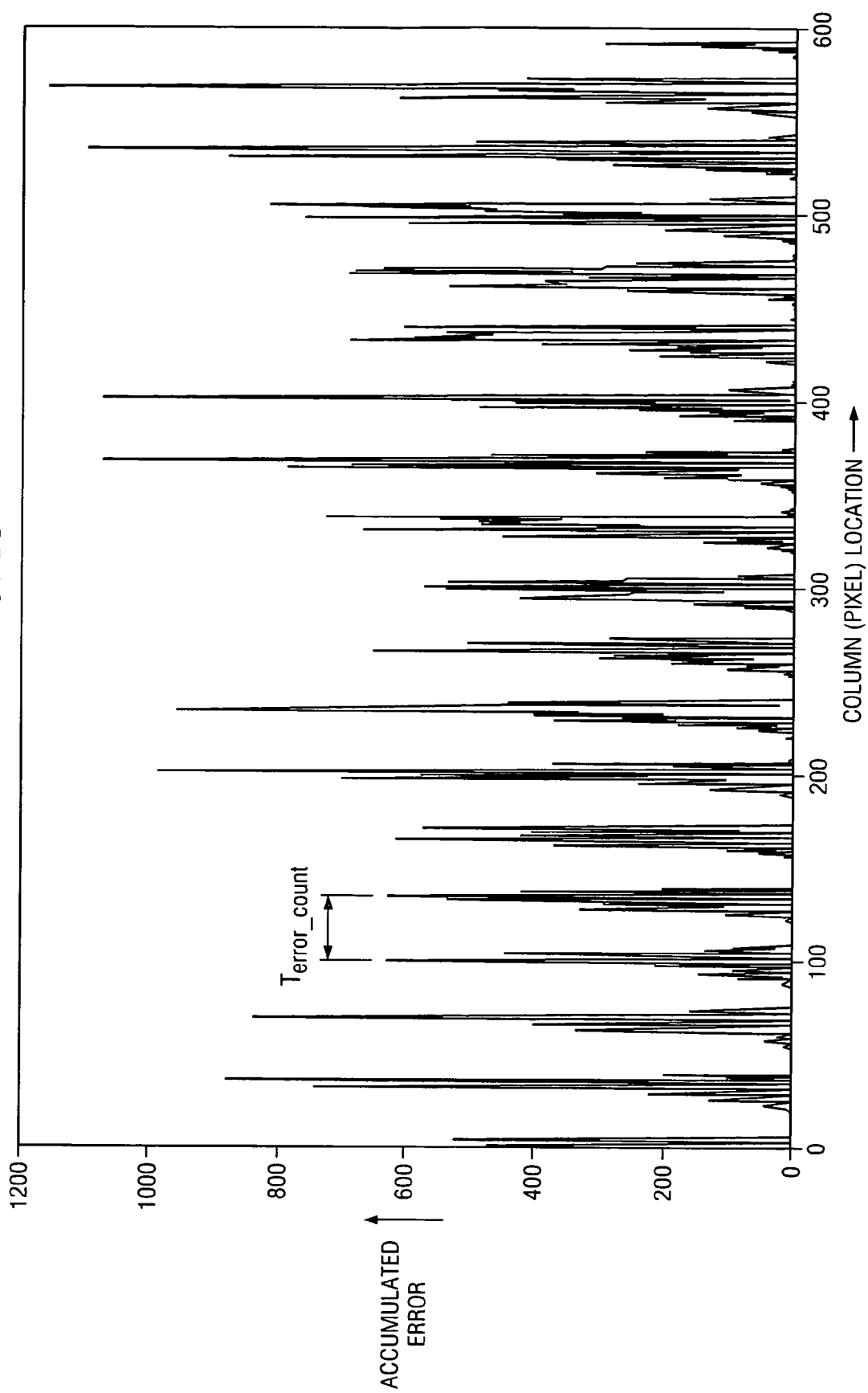
FIG. 13 illustrates a plot of summed pixel error column by column in a video image with unsynchronized sampling clock frequency, of an embodiment of the present invention.

When the current sampling clock frequency is different from the correct sampling clock, error count data computed column by column shows a periodic pattern against column location as illustrated in FIG. 13, with a period of $T_{error\_count}$. The columnar error count may also be calculated by only computing the frame_difference_count across columns in active areas of the image.

The period of this pattern is related to the clock offset by the following equation:

$$\text{clock\_offset} = \text{current\_clock} \cdot \left(\frac{1}{T_{error\_count}}\right), \quad (2)$$

and the new sample clock is:

$$\text{sample\_clock} = \text{current\_clock} \_ \text{clock\_offset}. \quad (3)$$

Based on equation (2) above, by determining the error count period $T_{error\_count}$, the clock frequency can be increased or decreased by the clock_offset. This observation forms the basis for an enhancement of the process for determining the correct clock sampling frequency in a further embodiment of the invention called Clock Offset Detection (COD).

An implementation of COD can be described as follows:
i. Use video framing information to determine a possible initial pixel resolution (such as XGA, SVGA, etc.);
ii. Obtain an initial clock frequency estimate based on the assumed resolution (such as from a table);
iii. Use a search (e.g., a binary search) for a region with a high error count;
iv. Compute the error count, preferably in a two pixel-wide column across this region (other column widths can be used);
v. Determine the error count period $T_{error\_count}$ based on the computed data;
vi. Compute the clock offset (clock_set) based on equation (2). (Note that the sign of the offset correction is not determined by the error count period $T_{error\_count}$);
vii. Reduce the clock period by the amount of the offset;
viii. Repeat steps iv-vi using the new clock period;
ix. If the new error count period is smaller than the period calculated from step v, then the clock needs to be adjusted in the opposite direction (i.e., increase the clock period by the amount of the offset because the sign of the error was not known).
x. Terminate the algorithm if:
   a. The new clock offset value (clock_offset) is less than a pre-defined threshold $th\_{offset}$. (For example, since all VESA compliant sources have clocks divisible by 8, the algorithm can set $th\_{offset}=4$, and round the final clock to the nearest value divisible by 8.);
   b. A pre-defined number of iterations has been reached.

Steps viii and ix enable the correct handling of sampling clock frequency of any wide-mode analog source, including wide-mode analog sources with sampling clock frequencies not contained in a table.

Figure 14:
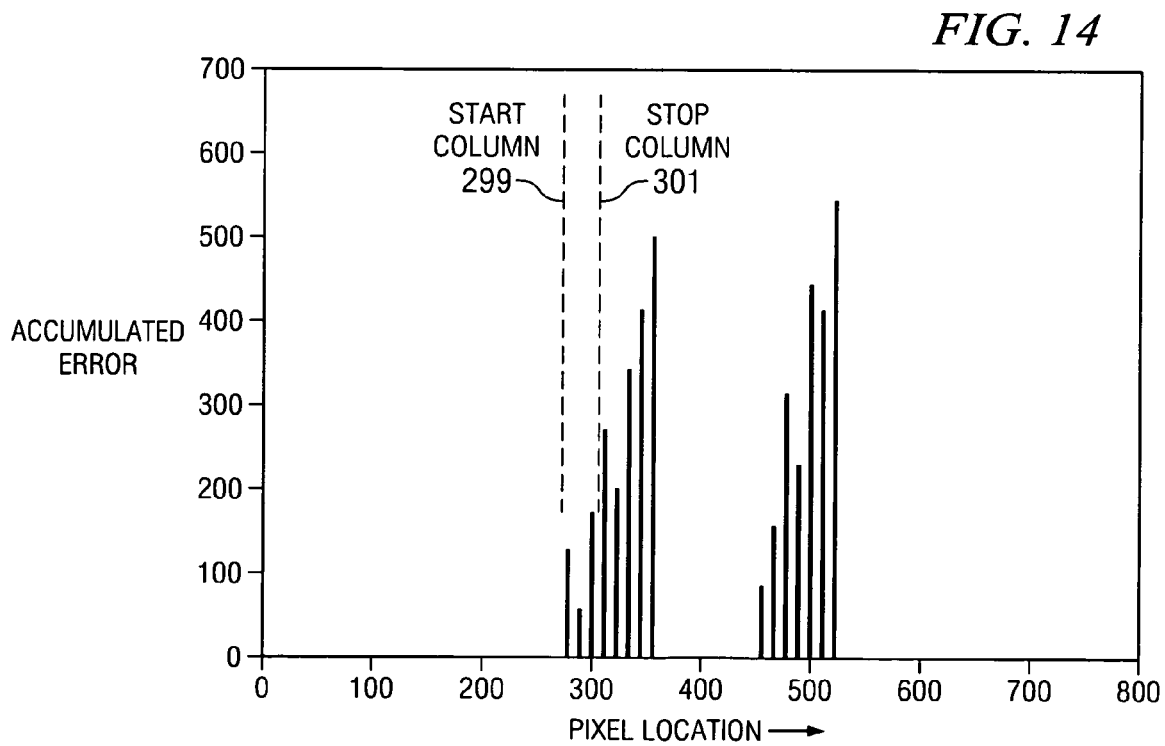
FIG. 14 illustrates a plot showing capturing pixel error data across three columns of a video image, of an embodiment of the present invention.

FIG. 14 illustrates capturing inter-frame pixel error count data column by column across three columns, starting at a first column, identified on the figure as column 299, and ending at a later column, identified on the figure as column 301.

In an implementation of the process to select the correct sampling clock frequency, a combination of CPA and COD is used to achieve adaptation to a wide range of input graphics sources and to ensure adequately fast frequency locking time.

A combined method using both CPA and COD can be performed using three steps:
i. CPA: In this step, the ADC sampling frequency is sequentially adjusted to several pre-defined sampling clock frequencies. CPA is run against each of these clock frequencies. If any sampling clock frequency has a CPA-ratio over a threshold, this clock will be regarded as the correct sampling clock. Steps ii and iii below will then be bypassed.
ii. COD: In this step the frame difference error count data is analyzed, and the clock is adjusted based on the clock offset computed from equation (2).
iii. POST-CPA: CPA is run against clocks within a certain percentage range of the sampling clock frequency computed from step ii, and the clock with highest CPA ratio is identified. If the ratio is also over the pre-defined threshold, this clock frequency is selected as the correct sampling clock frequency. Otherwise, the process is repeated, beginning at step ii.

The steps of an embodiment of the invention as described above utilize a ratio of the maximum frame_difference_count divided by the minimum frame_difference_count to produce a characteristic plot against sampling clock phase to assess synchronization of the sampling clock frequency and to adjust sampling clock frequency. In further embodiments of the invention, other measures of a video frame difference plotted against clock phase or column location can be used to assess or adjust sampling clock frequency. For example, measures such as a reciprocal of the ratio described above, or other measures such as general statistical measures of frame differences, including general measures based on pixel differences, variances of differences, etc., can also be used to produce a plot with a detectable characteristic to characterize or adjust sampling clock frequency.

Following are some examples, without limitation, of other metrics that are alternatives to the frame_difference_count described above that can be used to measure the difference between successive frames, within the broad scope of the invention.

Denote frame 1 as X, and its pixels as $x_{mn}$, and frame 2 as Y, and its pixels as $y_{mn}$. Use indexes m=1, 2, 3, . . . , M, and n=1, 2, 3, . . . ,N, to indicate horizontal and vertical pixel coordinates, respectively. The following represent exemplary alternatives for a measure of the difference between successive frames X and Y:

Euclidean Distance or Squared Sum of Distance (SSD):

$$d_e = \sqrt{\sum_{n=1}^{N} \sum_{m=1}^{M} (x_{mn} - y_{mn})^2}$$

City Block Distance or Sum of Absolute Distance (SAD):

$$d_{cb} = \sum_{n=1}^{N} \sum_{m=1}^{M} |x_{mn} - y_{mn}|$$

A variation of SAD as previously described above is the threshold-based SAD wherein:

$$d_{cbth} = \sum_{n=1}^{N} \sum_{m=1}^{M} f_{th}(|x_{mn} - y_{mn}|)$$

using the function $f_{th}$ for a threshold th defined as:

$$f_{th}(x) = \begin{cases} 1, & x > th \\ 0, & x < th \end{cases}$$

The variation of SAD can be described as a variation of the Hamming distance.

Canberra Distance:

$$d_{ca} = \sum_{n=1}^{N} \sum_{m=1}^{M} \frac{|x_{mn} - y_{mn}|}{x_{mn} + y_{mn}}$$

Squared Chord Distance:

$$d_{sc} = \sum_{n=1}^{N} \sum_{m=1}^{M} (\sqrt{x_{mn}} - \sqrt{y_{mn}})^2$$

Chi-Squared Distance:

$$d_{scs} = \sum_{n=1}^{N} \sum_{m=1}^{M} \frac{(x_{mn} - y_{mn})^2}{x_{mn} + y_{mn}}$$

Cosine Distance:

$$d_{\cos} = 1 - \frac{\sum_{n=1}^{N} \sum_{m=1}^{M} x_{mn} y_{mn}}{\sqrt{\sum_{n=1}^{N} \sum_{m=1}^{M} x_{mn}^2 \sum_{n=1}^{N} \sum_{m=1}^{M} y_{mn}^2}}$$

yshev Distance:

$$d_{cs} = \max_{m,n}(|x_{mn} - y_{mn}|)$$

An improvement of this process for determining pixel clock frequency over the prior art is the absence of a need for an accurate, underlying image aspect ratio or other image parameters such as refresh rate. If an assumed image aspect ratio is incorrect, the process is self correcting. Another improvement is the requirement for the image to have only some region with useful image detail, and not requiring active video data across the whole active region. A further improvement is not requiring all sources to have the same or a predictable aspect ratio. Therefore, it can handle wide-mode analog graphics sources with a variety of aspect ratios, including unpredicted aspect ratios, which are not easily handled with existing methods. Since the process does not require data to be filled across the whole active area, it can handle images with black borders, which existing methods handle with difficulty. And since the process does not require an update of a static look-up table when a new source format emerges, it requires minimal maintenance effort.

Although embodiments of the present invention and its advantages have been described in detail, it should be understood that various changes, substitutions and alterations can be made herein without departing from the spirit and scope of the invention as defined by the appended claims. For example, it will be readily understood by those skilled in the art that the methods and utilization of techniques to form the processes and systems providing accurate image sampling as described herein may be varied while remaining within the broad scope of the present invention. It will be further understood by those skilled in the art that other video signal representations such as YUV and gray-scale representations can be substituted for RGB video signal representations in processes described hereinabove with accommodations as necessary within the broad scope of the invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A video signal conversion device constructed to receive an analog signal of a video image formed as a sequence of frames of video lines of pixels, and to produce a digital signal representative of the video image, comprising:
- a clock with a selectable phase and a controllable frequency for controlling the sampling points of the analog signal;
- an analog-to-digital converter, coupled to the clock, for receiving the analog signal and converting it at sampling points controlled by the clock into the digital signal:
- a correction circuit that corrects the clock frequency using a period of a measure of the difference between successive frames taken in a columnar region of the video image, wherein the measure is a function that is dependent on columnar region location;
- a computation circuit to compute, for each phase in a sequence of selected phases for the clock, a second measure of the difference between successive frames of the video image, using the digital signal; and
- a verification circuit to verify the frequency of the clock using a characteristic of the second measure of the difference between successive frames, wherein the characteristic is the ratio of the maximum of the second measure over the sequence of selected phases to the minimum of the second measure over the sequence of selected phases.

2. The video signal conversion device according to claim 1, wherein the measure of the difference between successive frames is a count, taken over pixels in a columnar region at least one column wide of the video image, of the magnitude of the difference between a digitized pixel value in one frame and the corresponding digitized pixel value in a following frame, for the magnitude exceeding a threshold value.

3. The video signal conversion device according to claim 1, wherein the measure of the difference between successive frames taken in columnar regions at least one column wide of the video image is taken for columnar regions comprising a plurality of columns.

4. The video signal conversion device according to claim 1, wherein the clock frequency is corrected by increasing the clock frequency by an amount dependent on the period of the measure as a function of columnar location.

5. The video signal conversion device according to claim 1, wherein the second measure of the difference between successive frames is a count, taken over pixels, of the magnitude of the difference between a digitized pixel value in one frame and the corresponding digitized pixel value in a following frame, for the magnitude exceeding a threshold value.

6. The video signal conversion device according to claim 1, wherein the verification circuit to verify the frequency of the clock compares the characteristic to a threshold value.

7. The video signal conversion device according to claim 1, wherein the sequence of selected phases is a sequence of regularly spaced phases.

8. A method of converting an analog video signal of a video image formed as a sequence of frames of video lines of pixels into a digital video signal, the method comprising:
- coupling an analog-to-digital converter for receiving the analog signal to a clock with controllable frequency;
- sampling the analog signal at sampling points controlled by the clock for conversion into the digital signal;
- computing a measure for the digital signal of the difference between successive frames of the video image in a columnar region at least one column wide;
- observing a period of the measure as a function of columnar location;
- correcting the clock frequency using the period of the measure as a function of columnar location;
- computing, for each phase in a sequence of selected phases for the clock, a second measure of the difference between successive frames of the video image, using the digital signal; and
- verifying the frequency of the clock using a ratio of the maximum of the second measure over the sequence of selected phases to the minimum of the second measure over the sequence of selected phases between successive frames.

9. The method according to claim 8, wherein computing the measure for the digital signal of the difference between successive frames of the video image in columnar regions at least one column wide comprises computing a count, taken over pixels in a columnar region, of the magnitude of the difference between a digitized pixel value in one frame and the corresponding digitized pixel value in a following frame, for the magnitude exceeding a threshold value.

10. The method according to claim 8, wherein taking the count in columnar regions at least one column wide comprises taking the count for columnar regions comprising a plurality of columns.

11. The method according to claim 8, wherein correcting the clock frequency comprises increasing the clock frequency by an amount dependent on the period of the measure as a function of columnar location.

12. The method according to claim 8, including using a count, taken over pixels, of the magnitude of the difference between a digitized pixel value in one frame and the corresponding digitized pixel value in a following frame, for the magnitude exceeding a threshold value, for the second measure of the difference between successive frames.

13. The method according to claim 8, including verifying the frequency of the clock by comparing the characteristic to a threshold value.

14. The method according to claim 8, including using a sequence of regularly spaced phases for the sequence of selected phases.

15. A digital display device comprising a video signal conversion circuit constructed to receive an analog signal of a video image formed as a sequence of frames of video lines of pixels, and to produce a digital signal representative of the video image, comprising:
- a clock with a selectable phase and a controllable frequency for controlling the sampling points of the analog signal;
- an analog-to-digital converter, coupled to the clock, for receiving the analog signal and converting it at sampling points controlled by the clock into the digital signal;
- a correction circuit that corrects the clock frequency using a period of a measure of the difference between successive frames taken in a columnar region of the video image, wherein the measure is a function that is dependent on columnar region location; and
- a circuit:
  - to compute, for each phase in a sequence of selected phases for the clock, a second measure of the difference between successive frames of the video image, using the digital signal; and
  - to verify the frequency of the clock using a ratio of the maximum of the second measure over the sequence of selected phases to the minimum of the second measure over the sequence of selected phases of the difference between successive frames.

16. The digital display device according to claim 15, wherein the measure of the difference between successive frames is a count, taken over pixels in a columnar region at least one column wide of the video image, of the magnitude of the difference between a digitized pixel value in one frame and the corresponding digitized pixel value in a following frame, for the magnitude exceeding a threshold value.

17. The digital display device according to claim 15, wherein the measure of the difference between successive frames taken in columnar regions at least one column wide of the video image is taken for columnar regions comprising a plurality of columns.

18. The digital display device according to claim 15, wherein the clock frequency is corrected by increasing the clock frequency by an amount dependent on the period of the measure as a function of columnar location.

19. The digital display device according to claim 15, wherein the second measure of the difference between successive frames is a count, taken over pixels, of the magnitude of the difference between a digitized pixel value in one frame and the corresponding digitized pixel value in a following frame, for the magnitude exceeding a threshold value.

20. The digital display device according to claim 15, wherein the circuit for verifying the frequency of the clock compares the characteristic to a threshold value.

21. The digital display device according to claim 15, wherein the sequence of selected phases is a sequence of regularly spaced phases.

* * * * *